United States Patent [19]

Burgyan et al.

[11] Patent Number: 4,924,473
[45] Date of Patent: May 8, 1990

[54] LASER DIODE PROTECTION CIRCUIT

[75] Inventors: Lajos Burgyan, Palo Alto; Wilfred L. Hand, Mountain View, both of Calif.

[73] Assignee: Raynet Corporation, Menlo Park, Calif.

[21] Appl. No.: 329,797

[22] Filed: Mar. 28, 1989

[51] Int. Cl.$^5$ ............................................. H01S 3/04
[52] U.S. Cl. .................................... 372/38; 372/26; 372/31
[58] Field of Search .......................... 372/38, 26, 31

[56] References Cited

U.S. PATENT DOCUMENTS

| | | | |
|---|---|---|---|
| 4,633,525 | 12/1986 | Eumurian | 372/38 |
| 4,733,398 | 3/1988 | Shibagaki et al. | 372/38 |
| 4,789,987 | 12/1988 | Fraser | 372/38 |
| 4,819,241 | 4/1989 | Nagano | 372/38 |
| 4,831,626 | 5/1989 | Watanabe et al. | 372/38 |

FOREIGN PATENT DOCUMENTS 0018988  2/1983  Japan ................................. 372/38

Primary Examiner—Léon Scott, Jr.
Attorney, Agent, or Firm—Dennis E. Kovach; David B. Harrison

[57] ABSTRACT

A laser diode protection circuit includes an input connected to receive the RF amplitude modulating signal. A second RF amplifier is connected to amplify the received RF amplitude modulating signal and to put out an amplified signal. A sensing element such as differential amplifier or Schmitt trigger is connected to put out a control signal when the amplified signal exceeds in amplitude a reference level. A switching element preferably includes a series PIN diode network having a PIN diode connected in parallel in reverse conduction order across the laser diode. The switching arrangement is responsive to the control signal and effectively swamps or diverts the forward conduction current away from the laser diode thereby causing it to become reverse biased. A reverse bias connection is made to the PIN diode network for causing the PIN diode across the laser diode to be reverse biased whenever the control signal is not present thereby presenting the high impedance across the laser diode and also protecting the laser diode against excessive reverse bias potentials and electrostatic discharge protection. The switching element preferably includes a switching transistor having its control element connected to receive the control signal.

20 Claims, 3 Drawing Sheets

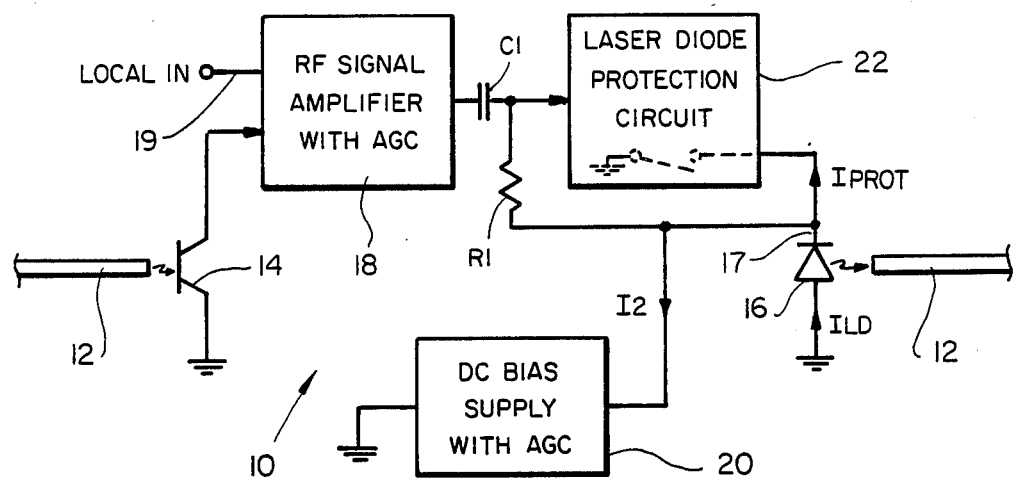
FIG_1
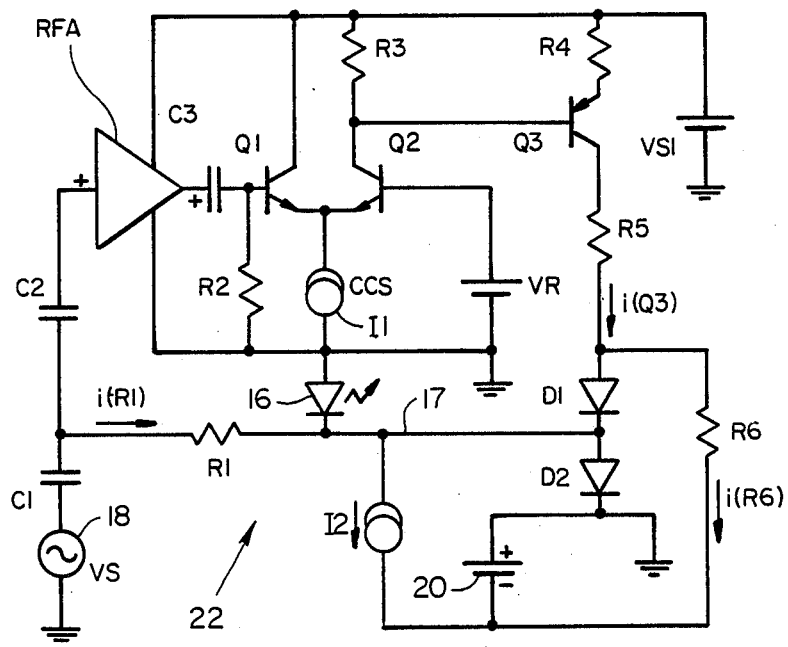
FIG_2

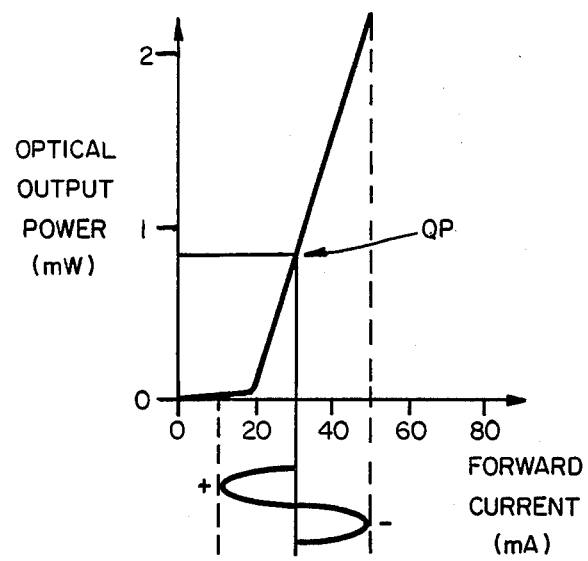
FIG_4
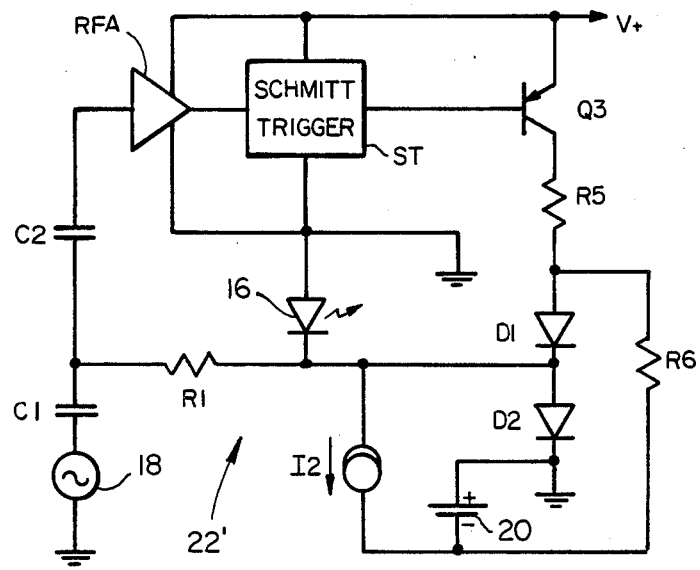
FIG_5

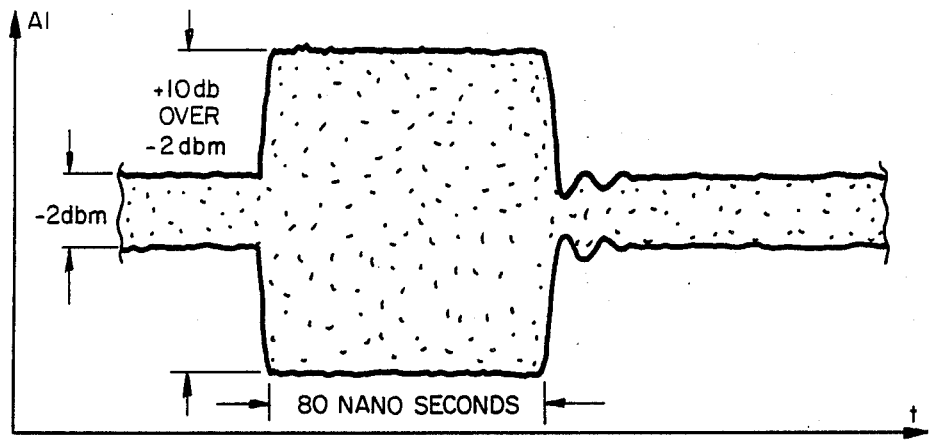
FIG_3A
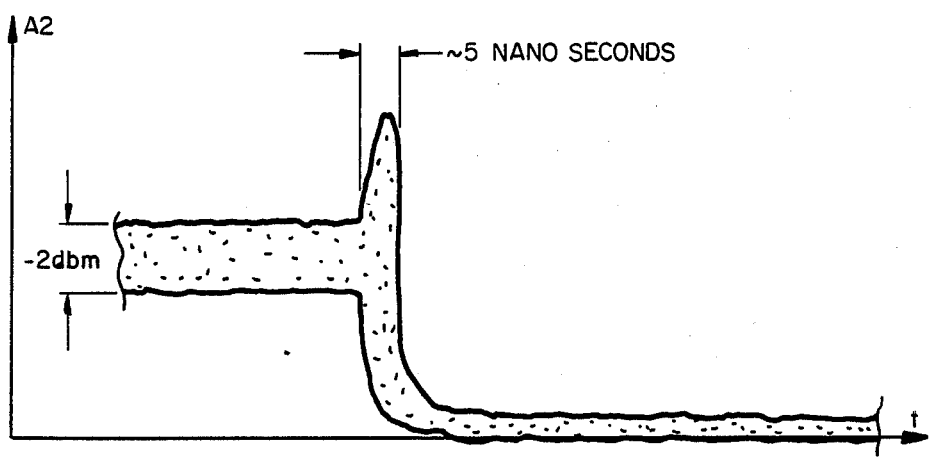
FIG_3B

LASER DIODE PROTECTION CIRCUIT

FIELD OF THE INVENTION

The present invention relates to protection circuits for laser diodes within communications networks. More particularly, the present invention relates to a fast-acting current limiting protection circuit for a laser diode which provides surge protection within a few nanoseconds without compromise of network linearity.

BACKGROUND OF THE INVENTION

Optical fiber communications networks are rapidly proliferating in the late 1980's. These networks have a number of distinct advantages over wire-based communications networks, not the least of which is much greater effective bandwidth. In such networks a coherent light beam is intensity modulated by a wide bandwidth spectrum carrying multiple channels. The modulation spectrum may extend, for example, from 40 MHz to 400 MHz, with channel center frequencies spaced every 20 MHz throughout this spectrum. An FM modulated carrier nominally at the center frequency of a channel carries a wideband signal, such as analog video information, over an 18 MHz useful bandwidth. Thus, the coherent light energy of the network is amplitude or intensity modulation carrying plural FM modulated subcarriers. Plural AM subcarriers may also be carried on optical fiber communications networks of the type contemplated herein.

The light energy transferred through a single mode optical fiber network is generated by laser diodes. These iodes are capable of generating about two miliwatts of light energy at an oscillating wavelength of e.g. 1300 nanometers. Because the diodes are very expensive (e.g. presently priced in a range between $2000 and $10,000 apiece) and because they are susceptible to damage and destruction if overdriven, a variety of automatic gain control protection schemes have been proposed in the art.

The problem of protecting the laser diode against overdrive for surges in a range between 5 nanosecond and 100 microseconds is compounded within a telecommunications network. If, for example, the excitation signal is momentarily removed from the transmitting end of the network, as when a technician switches a plug or connection, the automatic gain systems throughout the network cause the gains of all of the repeater stations to approach their maximum values. When the transmit signal is thereafter reapplied to the network, because of the e.g. 100 microsecond latency of each AGC circuit, a significant burst of energy is put out by each laser diode during the interval between first reapplication of the signal and response by the AGC circuit, with damaging and sometimes destructive consequences.

Excessive excitation over time causes excessive heating and stress within the laser diode structure. Since the heating is localized in a very small area, the heat density becomes very high. If the heat energy cannot be dissipated or drawn off fast enough, the diode may be damaged or destroyed. While the laser diode is designed to be capable of withstanding application of significant heat energy for very short time intervals, and is frequently rated at higher power levels for pulsed signal excitation as opposed to continuous excitation, the laser diode cannot handle continuous excessive heat for very long. Damage from excessive heating is manifested in shortened useful lifetime and/or reduced light energy emission. Destruction is characterized by catastrophic failure of the device. While destruction is the usual consequence of extended overload conditions, the more frequently occurring problem, and the one of greatest concern is the gradual degradation of the laser diode resulting from successive non-catastrophic overloads, overloads of moderate duration.

Since laser diodes have been used most frequently within digital networks wherein the information is contained within transitions between discrete levels, fast acting clamping diodes have been typically provided at the laser diode. While clamping diodes do not unduly distort digital information modulation, the clamping diodes introduce unacceptable nonlinearities when the light beam carries analog signal modulation.

Another approach has been to provide laser diode driver circuits which are designed to operate very close to a voltage supply rail, i.e. with very little "headroom". The maximum signal level put out by the driver circuit is thereby clamped to be no greater than the voltage supply rail. These circuits, while entirely satisfactory for digital modulation, are not satisfactory for analog signals which must be kept linear over a much wider dynamic range than digital signals. In order to achieve and maintain linearity within analog systems, amplifiers must have a significant margin for signal handling capability; this margin leads directly to the potential for laser diode overdrive.

Other schemes including optical feedback control loops either have been too slow to provide adequate protection or have not lent themselves to inclusion within optical coupling devices for coupling the laser diode generated light energy to the optical fiber.

Thus, a hitherto unsolved need has arisen for a laser diode protection method within an analog communications network which works effectively over a very short time period in order to prevent excessive excitation impulses from reaching the laser diode without compromise of system linearity.

SUMMARY OF THE INVENTION WITH OBJECTS

A general object of the present invention is to provide a protection method, and circuits for implementing the method, for an analog modulated laser diode which is triggerable within a few nanoseconds to prevent excitation surges from damaging the laser diode and without compromising system linearity.

A more specific object of the present invention is to is to provide a protection method which provides effective protection to a laser diode against excessive amplitude, short duration RF excitation surges in the forward conduction mode while also providing for protection against excessive reverse conduction potentials.

One more specific object of the present invention is to provide a laser diode protection method which may be implemented with circuits assembled from presently existing components and elements at relatively low cost, which works quickly, effectively and reliably to protect the laser diode against dynamic momentary RF drive amplitude modulation surges, which protects the laser diode against excessive reverse conduction voltages within widely variant operating conditions and environments, and which does not require any optical energy feedback from the laser diode for effectiveness.

A laser diode protection method of the present invention operates to protect a laser diode within an analog optical fiber communications network. The method is implemented within circuitry including the laser diode and a DC bias supply for supplying forward conduction current to the laser diode to cause it to emit light energy at a predetermined quiescent operating point and an RF amplifier for supplying an RF amplitude modulating signal to the laser diode for modulating the intensity of the emitted light energy about the quiescent operating point so that the intensity-modulated light energy carrying analog information may be injected into the optical fiber communications network.

In one implementation of the method of the present invention an improved laser diode protection circuit comprises:

electrical sensing circuitry for sensing instantaneous amplitude of the RF amplitude modulating signal to detect amplitude surges therein, and electrical switching circuitry responsive t.o the sensing circuitry and connected for effectively removing forward conduction current from the laser diode during the sensed amplitude surges in the RF amplitude modulating signal thereby to cause the laser diode to reduce emission of light energy, the electrical switching circuitry otherwise providing a very high impedance to the laser diode during its nominal operating conditions about the quiescent point.

In another aspect of circuitry embodying the present invention a laser diode protection circuit includes an input connected to receive the RF amplitude modulating signal. A second RF amplifier is connected to amplify the received RF amplitude modulating signal and to put out an amplified signal. A differential amplifier is connected to compare the amplified signal with a reference signal and to put out a control signal when the amplified signal exceeds in amplitude the reference signal. A switching arrangement includes a series PIN diode network having a PIN diode connected in parallel in reverse bias arrangement across the laser diode. The switching arrangement is responsive to the control signal and effectively swamps or diverts the forward conduction current away from the laser diode thereby causing it to become reverse biased. A reverse bias connection is made to the PIN diode network for causing the PIN diode across the laser diode to be reverse biased whenever the control signal is not present thereby presenting a very high impedance across the laser diode and also protecting the laser diode against excessive reverse bias potentials and electrostatic discharge protection. The switching arrangement preferably includes a switching transistor having its control element connected to receive the control signal.

In a further aspect of circuitry embodying the present invention, a laser diode protection circuit includes an input connected to receive the RF amplitude modulating signal. A third RF amplifier is connected to amplify the received RF amplitude modulating signal and to put out an amplified signal. A Schmitt trigger is connected to receive the amplified signal and to put out a control signal when the amplified signal exceeds in amplitude a predetermined trigger level of the Schmitt trigger circuit. A switching element preferably includes a protection diode network having a diode connected in parallel in reverse bias arrangement across the laser diode. The switching element is responsive to the control signal and thereupon effectively swamps or diverts forward conduction current from the laser diode thereby causing it to become reverse biased and its light output to be reduced to a safe level.

These and other objects, advantages, aspects and features of the present invention will be more fully understood and appreciated upon consideration of the following detailed description of a preferred embodiment, presented in conjunction with the accompanying drawings.

BRIEF DESCRIPTION OF THE DRAWINGS

In the Drawings:

FIG. 1 is a block diagram of a node within a wideband optical fiber telecommunications network including a laser diode and a laser diode protection circuit in accordance with the principles of the present invention.

FIG. 2 is a circuit schematic of one presently preferred embodiment of the FIG. 1 laser diode protection circuit.

FIGS. 3A and 3B are two oscillographs of excitation and response waveforms respectively of the FIG. 2 circuit.

FIG. 4 is a graph of the transfer characteristics of the laser diode of FIG. 1 showing light energy output response to sinusoidal excitation of excessive amplitude for positive and negative half cycles of the excitation.

FIG. 5 is a circuit schematic of a second presently preferred embodiment of the FIG. 1 laser diode protection circuit.

DETAILED DESCRIPTION OF A PREFERRED EMBODIMENT

FIG. 1 shows a node 10 within a single-mode optical fiber wideband network. The network includes a single-mode optical fiber 12, a photodetector 14 coupled to the optical fiber 12 to receive light energy and convert it into analog electrical signals, and a light energy emitting laser diode 16 also coupled to the optical fiber 12 for injecting light energy into the fiber 12. The laser diode 16 is connected between a node 17 and ground. A broadband linear RF signal amplifier 18 processes the analog electrical signals received from the photodetector 14 and couples a wideband modulating signal through a DC blocking capacitor C1 and through a voltage to current conversion resistor R1 to the laser diode 16. The amplifier 18 includes an AGC circuit which automatically adjusts the gain of the amplifier to put out a minus 1.0 dBm driving signal (e.g. 560 millivolts, peak-to-peak across 50 ohms) irrespective of incoming signal level. In this manner, compensation is provided automatically for variations in average light energy levels due to ageing of the laser diodes of the network for example.

While the RF amplifier 18 is depicted in FIG. 1 as a repeater amplifier within the network, it may likewise be at the transmission origination end and actually generate one or more frequency modulated subcarriers within the 40 to 400 MHz bandwidth of the network. Or, in response to a locally supplied signal on a line 19, it may generate and inject one or more additional subcarriers into the network at a location intermediate the ends thereof, as well as amplify the other energy components received at the photodetector 14.

A DC bias supply 20 is connected directly to the laser diode 16 in order to provide a constant current I2 for establishing a quiescent operating point at the midrange of a linear portion of the transfer characteristic of the laser diode, shown as point QP in FIG. 4. The RF signal put out by the wideband amplifier circuit 18 adds to and subtracts from the current I2 and thereby causes the laser diode to put out an intensity modulated light beam.

A protection circuit 22 in accordance with the principles of the present invention generates and puts out a protection current Iprot to the laser diode 16 in response to a signal put out by the amplifier 18 in excess of a predetermined level, such as 10 db over nominal driving signal level (−2dbm). The protection current Iprot is put out within several nanoseconds of detection of excess excitation and reverse biases the laser diode 16 and sumps the bias current I2 to ground, thereby protecting the laser diode 16 against excessive drive over time. The protection circuit 22 also preferably protects the laser diode 16 against reverse conduction potentials in excess of a predetermined nominal rating voltage, typically two volts, and it further protects the laser diode 16 against electrostatic discharges and potentials. These functions are accomplished by the protection circuit 22 without any noticeable degradation of the linearity of the driving signal when it is within nominal amplitude levels.

FIG. 2 sets forth a schematic circuit diagram illustrating the structure of one presently preferred embodiment of the protection circuit 22. Capacitor C2 couples the incoming RF signal from the voltage source (amplifier 18) to a noninverting input of an RF amplifier RFA. The RF amplifier RFA is coupled to a base of a transistor Q1 of a differential amplifier comprising transistors Q1 and Q2 and a constant current source CCS which supplies a constant current I1 to the emitters of the transistors Q1 and Q2. The transistors Q1 and Q2 are very high speed NPN switching transistors having their collectors connected to a positive voltage rail provided from a voltage supply VS1. The collector of the transistor Q1 is connected directly to the voltage rail, while the collector of the transistor Q2 is connected to the voltage rail through a resistor 3.

Under normal quiescent conditions, the base c,f the transistor Q1 is held at ground potential by the resistor R2 and Q1 does not conduct. A positive bias voltage from a constant voltage source VR is applied to the base of the transistor Q2. This bias voltage causes the transistor Q2 to conduct which creates a voltage drop across its collector resistor R3.

The collector of transistor Q2 is connected directly to the base of a very high speed PNP switching transistor Q3 having its emitter connected to the positive voltage rail through a resistor R4 and having its collector connected through a resistor R5 to a series array of diodes D1 and D2 leading to ground. The diodes D1 and D2 are preferably PIN diodes mounted in very low capacitance packages. The diode D2 is connected in parallel in reverse bias arrangement across the laser diode, i.e. the cathode of the diode D2 leads to ground, whereas the anode of the laser diode 16 leads to ground. The node between the diodes D1 and D2 is common with the node 17 of the laser diode 16. When Q2 is conducting (during nominal operating conditions) the voltage at its collector (and at the base of the transistor Q3) approaches ground potential, which causes Q3 to be cut off from conduction.

When a positive going peak of the RF signal at the base of the transistor Q1 exceeds the threshold established by the bias voltage VR at the base of the transistor Q2, transistor Q1 conducts, and transistor Q2 ceases to conduct, thereupon causing the voltage at its collector to approach the positive rail and causing the transistor Q3 to conduct. When the transistor Q3 conducts, the PIN diodes D1 and D2 become forward biased. The peak collector current of the transistor Q3 provides the protection current Iprot which is of sufficient magnitude to clamp the node 17 at about plus one volt, which is the voltage drop across the PIN diode D2 in forward conduction. This plus one volt potential reverse biases the laser diode 16 within a safe range and causes it to cease light emission, thereby protecting it from overload.

When the transistor Q3 is not conducting, a resistor R6 connected to the bias supply 20 reverse biases the diodes D1 and D2. The diodes D1 and D2 prevent the laser diode 16 from reverse voltage breakdown and provide electrostatic discharge protection. While the diodes D1 and D2 are reverse biased, they present a negligible reactive load at the node 17, on the order of one half picofarad or less. This negligible reactive loading enhances the linearity of circuit operation during nominal operating conditions.

FIG. 3A graphs a pulse of RF energy at e.g. 100 MHz which is approximately 80 nanoseconds in duration and 10 db over the nominal operating signal level (e.g. −1dbm or 560 millivolts). The pulse is applied at the input of the RF amplifier 18. FIG. 3B graphs the response of the protection circuit 22 to the incoming pulse. As can be seen, there is about 35 nanoseconds of latency between the time that the pulse is applied to the amplifier 18 and the time that it reaches the laser diode 16. The protection circuit 22 acts within about 5 nanoseconds to quench all forward direction current flow in the laser diode 16 and cause its light energy output to become extinguished.

Since light output from the laser diode 16 is extinguished, a control loop within the DC bias supply 20 acts to restore current. Since this action is in direct conflict with operation of the protection circuit, a time delay is added to the circuit 20 so that it does not counteract the action of the protection circuit, until the AGC action of the RF amplifier circuit 18 has had sufficient time to reduce gain of the RF driving signal to the nominal operating level, usually within about 100 microseconds.

FIG. 4 graphs a cycle of excessive drive excitation about the quiescent point QP. The positive half cycle drives the laser diode toward and beyond the light emission threshold current of e.g. 20 milliamperes. Thus, there is no need to protect the laser diode against excessive positive half cycles. However, the negative half cycle drives the laser diode beyond its nominal operating region and must be protected against.

The circuit of FIG. 2 operates on the positive half cycle, since it is that half cycle which drives the transistor Q1 into conduction and causes the transistor Q2 to shut off and transistor Q3 to conduct. Time constants within the circuit 22 cause it to operate for the entire cycle, and not just the positive half cycle.

In its presently preferred form, the circuit 22 is assembled from the following circuit components
Q1, Q2: Motorola type MRF962
Q3: Motorola type MRF5583
D1, D2 Hewlett Packard type QPND4109 PIN Diodes
RFA: type MSA-0885
Laser Diode 16: Mitsubishi type FU-44SLD-1.

The circuit 22 may be effectively implemented with many widely varying arrangements of circuit elements. For example, FIG. 5 shows a modified protection circuit 22' which substitutes a Schmitt trigger ST for the differential amplifier circuit element included within the protection circuit 22 depicted in FIG. 2. The RF amplifier RFA establishes a nominal signal level below the predetermined threshold of the Schmitt trigger circuit ST. By definition, the Schmitt trigger is a bistable pulse generator which generates and puts out a logical pulse of constant amplitude only for so long as the input voltage exceeds a predetermined DC value, i.e. its threshold. The Schmitt trigger includes positive feedback within its internal switching configuration, and so, once the Schmitt trigger circuit ST is triggered, the output pulse appears very rapidly. The output pulse causes the transistor Q3 to conduct, which in turn causes the protection diodes D1 and D2 to conduct and thereby protect the laser diode 16. Once the incoming signal returns to its proper level below the threshold, the output pulse ends, and the diodes D1 and D2 become reverse biased.

To those skilled in the art to which the present invention pertains many widely differing embodiments will be suggested by the foregoing without departing from the spirit and scope of the present invention. The descriptions and disclosures herein are intended solely for purposes of illustration and should not be construed as limiting the scope of the present invention which is more particularly pointed out by the following claims.

We claim:

1. A method for protecting a laser diode included within an electro-optical circuit including: the laser diode, a DC bias supply for supplying forward conduction current to the laser diode to cause it to emit light energy at a predetermined quiescent operating point, and an RF amplifier means for supplying an RF amplitude of an analog modulating signal to the laser diode for modulating the intensity of the emitted light energy about the quiescent operating point thereof, the method including providing a very high impedance to said laser diode during its nominal operating conditions about said quiescent point and, the steps of:

sensing an instantaneous amplitude of the RF amplitude modulating signal to detect amplitude surges therein, responding to the sensing means by removing forward conduction current from the laser diode during the sensed amplitude surges in the RF amplitude of the analog modulating signal, thereby causing the laser diode to reduce emission of light energy to a safe level.

2. In an electro-optical circuit including: a laser diode, a DC bias supply for supplying forward conduction current to the laser diode to cause it to emit light energy at a predetermined quiescent operating point, and an RF amplifier means for supplying an RF amplitude of an analog modulating signal to the laser diode for modulating an intensity of the emitted light energy about the quiescent operating point during normal operations thereof, an improved laser diode protection circuit comprising:

electrical sensing means for sensing instantaneous amplitude of the RF amplitude of the modulating signal to detect amplitude surges therein, electrical switching means responsive to the sensing means and connected for effectively removing forward conduction current from the laser diode during the sensed amplitude surges in the RF amplitude modulating signal, thereby to cause the laser diode to reduce emission of light energy to a safe level, the electrical switching means providing a very high impedance to the laser diode during the normal operations thereof.

3. The laser diode protection circuit set forth in claim 2 wherein the electrical sensing means includes threshold setting means for establishing a threshold amplitude value, and analog comparator means for comparing the threshold amplitude value and the RF amplitude modulating signal, whereby amplitude surges therein are sensed as being in excess of the threshold amplitude value.

4. The laser diode protection circuit set forth in claim 3 wherein the analog comparator means comprises a differential amplifier having one input for receiving the RF amplitude modulating signal and having another input for receiving the threshold amplitude value.

5. The laser diode protection circuit set forth in claim 4 wherein the differential amplifier includes a constant current source for supplying constant current to the differential amplifiers, and a load resistor across which a signal indicative of comparison state is developed.

6. The laser diode protection circuit set forth in claim 2 wherein the electrical sensing means comprises a Schmitt trigger having a predetermined input threshold signal level above which the Schmitt trigger generates and puts out a control pulse to operate the switching means.

7. The laser diode protection circuit set forth in claim 2 wherein the switching means comprises a series network of a switching transistor and a switching diode connected in in parallel in reverse conduction order across the laser diode and wherein the switching transistor has a control element connected to the electrical sensing means so that when the switching diode conducts, current flow through the switching diode in reverse sense of the forward conduction current swamps the forward conduction current and causes the laser diode to become reverse biased.

8. The laser diode protection circuit set forth in claim 7 wherein the electrical sensing means includes threshold setting means for establishing a threshold amplitude value and analog comparator means for comparing the threshold amplitude value and the RF amplitude modulating signal, whereby amplitude surges therein are sensed as being in excess of the threshold amplitude value.

9. The laser diode protection circuit set fort h in claim 8 wherein the analog comparator means comprises a differential amplifier having one input for receiving the RF amplitude modulating signal and having another input for receiving the threshold amplitude value.

10. The laser diode protection circuit set forth in claim 8 wherein the differential amplifier includes a constant current source for supplying constant current to the differential amplifiers, and further includes a load resistor across which a signal indicative of comparison state is developed; and wherein the control element is connected to the load resistor.

11. The laser diode protection circuit set forth in claim 7 wherein the electrical sensing means comprises a Schmitt trigger having a predetermined input threshold signal level above which the Schmitt trigger generates and puts out a control pulse to operate the switching means.

12. The laser diode protection circuit set forth in claim 7 further comprising a second diode connected in the series network between the transistor and the switching diode and in the same polarity order as the switching diode, and a reverse bias resistor connecting the node between the second diode and the transistor to a reverse bias potential source so that the switching diode and the second diode are reverse biased whenever the transistor is not conducting, thereby presenting the high impedance across the laser diode and also protecting the laser diode against excessive reverse bias potentials and electrostatic discharge protection.

13. The laser diode protection circuit set forth in claim 12 wherein the switching diode and the second diode are PIN diodes having matched characteristics.

14. The laser diode protection circuit set forth in claim 7 wherein the switching diode comprises a PIN diode.

15. In an electro-optical circuit including a laser diode, a DC bias supply for supplying forward conduction current to the laser diode to cause it to emit light energy at a predetermined quiescent operating point, and a first RF amplifier means for supplying an RF amplitude of an analog modulating signal to the laser diode for modulating an intensity of the emitted light energy about the quiescent operating point, an improved laser diode protection circuit comprising:

an input connected to receive the RF amplitude modulating signal, second RF amplifier means connected to amplify the received RF amplitude modulating signal and to provide an output of amplified signal, differential amplifier means connected to compare the amplified signal with a reference signal and to provide an output of a control signal when the amplified signal exceeds in amplitude the reference signal, switching means including a series PIN diode network including a PIN diode connected in parallel in reverse conduction order across the laser diode, the switching means responsive to the control signal for diverting forward conduction current away from the laser diode and for causing it to become reverse biased, and reverse bias means connected to the PIN diode network for causing the PIN diode across the laser diode to be reverse biased whenever the control signal is not present thereby presenting a high impedance across the laser diode.

16. The protection circuit set forth in claim 15 wherein the switching means includes a switching transistor having its control element connected to receive the control signal.

17. The protection circuit set forth in claim 15 wherein the PIN diode network also protects the laser diode against excessive reverse bias potentials and electrostatic discharges.

18. In an electro-optical circuit including: a laser diode, a DC bias supply for supplying forward conduction current to the laser diode to cause it to emit light energy at a predetermined quiescent operating point, and a first RF amplifier means for supplying an RF amplitude of an analog modulating signal to the laser diode for modulating an intensity of the emitted light energy about the quiescent operating point, an improved laser diode protection circuit comprising:

an input connected to receive the RF amplitude modulating signal, second RF amplifier means connected to amplify the received RF amplitude modulating signal and provide an output of an amplified signal, Schmitt trigger means connected to compare the amplified signal with an internally established threshold level and to provide an output of a control signal when the amplified input signal exceeds in amplitude the threshold level, switching means including a series PIN diode network including a PIN diode connected in parallel in reverse conduction order across the laser diode, the switching means responsive to the control signal for diverting forward conduction current away from the laser diode and for causing it to become reverse biased, and reverse bias means connected to the PIN diode network for causing the PIN diode across the laser diode to be reverse biased whenever the control signal is not present thereby presenting a high impedance across the laser diode.

19. The protection circuit set forth in claim 18 wherein the switching means includes a switching transistor having its control element connected to receive the control signal.

20. The protection circuit set forth in claim 18 wherein the PIN diode network also protects the laser diode against excessive reverse bias potentials and electrostatic discharges.

* * * * *